US 9,160,308 B2

(12) United States Patent
Nestler

(10) Patent No.: US 9,160,308 B2
(45) Date of Patent: Oct. 13, 2015

(54) SYNCHRONOUS CHARGE SHARING FILTER

(71) Applicant: Analog Devices, Inc., Norwood, MA (US)

(72) Inventor: Eric Nestler, Concord, MA (US)

(73) Assignee: Analog Devices, Inc., Norwood, MA (US)

( * ) Notice: Subject to any disclaimer, the term of this patent is extended or adjusted under 35 U.S.C. 154(b) by 125 days.

(21) Appl. No.: 14/099,064

(22) Filed: Dec. 6, 2013

(65) Prior Publication Data

US 2015/0162894 A1    Jun. 11, 2015

(51) Int. Cl.
*H03K 5/00* (2006.01)
*H03H 11/04* (2006.01)

(52) U.S. Cl.
CPC ................. *H03H 11/0405* (2013.01)

(58) Field of Classification Search
CPC ............ H03H 11/1291; H03H 19/004; H03H 21/0001; H03H 21/0007
USPC ......................................... 327/552–554, 577
See application file for complete search history.

(56) References Cited

U.S. PATENT DOCUMENTS 5,982,229 A * 11/1999 Wong et al. .................... 327/554
6,614,374 B1 * 9/2003 Gustavsson et al. .......... 341/143
8,188,753 B2 5/2012 Nestler et al.

* cited by examiner

*Primary Examiner* — An Luu
(74) *Attorney, Agent, or Firm* — Patent Capital Group

(57) ABSTRACT

A signal processing device has a first discrete time analog signal processing section, which has an input, an output, a plurality of charge storage elements, and plurality of switch elements coupling the charge storage elements. The device has a controller coupled to the first signal processing section configured to couple different subsets of the charge elements of the first signal processing section in successive operating phases to apply a signal processing function to an analog signal presented at the input of the first signal processing section and provide a result of the applying of the signal processing function as an analog signal to the output of first signal processing section. The signal processing function of the first signal processing section comprises a combination of a filtering function operating at a first sampling rate and one or more modulation functions operating at corresponding modulation rates lower than the first sampling rate.

19 Claims, 3 Drawing Sheets

SYNCHRONOUS CHARGE SHARING FILTER

BACKGROUND

This invention relates to synchronous filtering using a charge sharing structure.

Filtering of analog signals often involves modulation or demodulation in order move signals of interest from one frequency to another. An example relates processing a continuous time signal x(t) to recovery of a signal component with energy in the vicinity of $f_c$ (Hertz) by first bandpass filtering the input signal x(t) retaining signal components in the vicinity of $f_c$ and then modulating the signal with a periodic signal m(t) with a period $1/f_c$. Referring to FIG. 1, a filter system 10 includes an analog continuous time bandpass filter 14, for example, implemented using discrete circuit components. The output of the bandpass filter is passed to a mutliplexor 16, which periodically switches between passing (i.e., tracking) the output of the bandpass filter and outputting a zero value. Functionally this clocked multiplexor is equivalent to multiplying by a squarewave signal that alternative between 0.0 and 1.0 with a frequency $f_c$ and a duty cycle of 50%. The square wave signal has frequency components at zero frequency ("DC"), frequency $f_c$ as well as at the odd harmonics of $f_c$. Therefore, in the frequency domain, the spectrum of the multiplexor 16 is a convolution of the bandpass signal output convolved with the odd harmonics of $f_c$. Therefore, the desired signal in the vicinity of $f_c$ in x(t) is modulated to zero frequency, as are the components of the output of the bandpass filter at the odd harmonics of $f_c$. To the extent that the bandpass filter sufficiently attenuated the signal in the vicinity of those harmonics, their impact on the output of the multiplexor 106 is not significant. In this example, the output of the modulator 16 (i.e., the output of the filter system 10) is passed through a lowpass filter and an analog to digital converter 18 for further processing. (Note that in some such implementations, the alternation is between the output of the bandpass filter and an inversion (negative) of the filter output.) The analog lowpass filter filters out odd harmonics of $f_c$ introduced by virtue of the multiplexor not implementing a multiplication by an ideal sinusoid. In some such examples, the multiplexor is implemented using Balanced Modulator/Demodulator, part AD630, manufactured by Analog Devices, Inc.

With the bandpass filter 14 implemented in analog components, the phase and magnitude at the desired center frequency $f_c$ may be difficult to control. For example, small changes in the actual center frequency of the filter may have relatively large effects on the phase at the desired (as opposed to actual filter) center frequency. Therefore, even if the modulation frequency for the multiplexor is exactly $f_c$, the unpredictable phase response of the filter may make it difficult to achieve coherent processing.

Modulator blocks are used in a variety of other applications at the input and/or output of analog filter blocks, for example, implemented as analog circuits or implemented using discrete time digitized sample signal processors.

SUMMARY

In one aspect, in general, an approach to modulation or demodulation functions are integrated into a passive charge sharing filter of a type described U.S. Pat. No. 8,188,752, titled "Analog Computation," issued in May 29, 2012, or in U.S. Pat. Pub. 2012/0306569, titled "Charge Sharing Time Domain Filter," published on Dec. 6, 2012, thereby avoiding the need to include a separate modulator part for us in conjunction with a filter. In some examples, a configurable filter, which uses passive charge sharing techniques, is combined with modulator functions at the input or output of the filter, or between internal filter blocks, within an integrated device (i.e., within a single part).

In another aspect, in general, a signal processing device has a first discrete time analog signal processing section, which has an input, an output, a plurality of charge storage elements, and plurality of switch elements coupling the charge storage elements. The device also has a controller coupled to the first signal processing section configured to couple different subsets of the charge elements of the first signal processing section in successive operating phases to apply a signal processing function to an analog signal presented at the input of the first signal processing section and provide a result of the applying of the signal processing function as an analog signal to the output of first signal processing section. The signal processing function of the first signal processing section comprises a combination of a filtering function operating at a first sampling rate and one or more modulation functions operating at corresponding modulation rates lower than the first sampling rate.

Aspects may include one or more of the following features.

The signal processing function comprises a second modulation function of the one or more modulation functions applied to result of the filtering function and/or the filtering function applied to a result of a first modulation function of the one or more modulation functions.

The controller is configured to implement the second modulation function having a modulation period by passing signal values proportional to the result of the filtering function for half the modulation period, and where the output values in the other half of the modulation period are either zero, a constant value determined from the result of the filtering function, or proportional to a negative of the result of the filtering function.

The controller is configured to implement the second modulation function to provide output values that are proportional to products of the results of the filtering section and values of a periodic modulation signal.

The controller is configured to implement the first modulation function by storing values in a first set of the charge storage elements of the first discrete time analog signal processing according to the modulation function.

The controller is configured to implement the first modulation function by storing values in a first set of the charge storage elements of the first discrete time analog signal processing according to the input to said first section, and to scale said values according to the modulation function in applying the filtering function.

The filtering function comprises a linear time invariant (LTI) filtering function. For example, the LTI filtering function comprises an infinite impulse response filtering function.

The controller is configured to synchronize discrete time application of the filtering function and the one or more modulating functions.

The signal processing device further comprises a decimator section, which has an input and an output coupled to the input of the first discrete time analog signal processing section.

The decimator section comprises a plurality of charge storage elements, and plurality of switch elements coupling the charge storage elements, and the controller is further configurable to couple different subsets of the charge elements in successive operating phases to apply discrete time lowpass filtering function at an input sampling rate to an analog signal presented at the input of the decimator and provide a representation of the analog signal presented at said input at the first sampling rate lower that the input sampling rate.

The signal processing device further comprises a synchronous processing section coupled to the output of the a first discrete time analog signal processing section; wherein the controller is configured to synchronize operation of the synchronous processing section and the modulation function of the first signal processing section.

The synchronous processing section comprises an analog to digital converter (ADC) converting an analog output from the first discrete time analog signal processing section to digital form. In some examples, the synchronous processing section comprises a digital summing section configured to sum outputs of the ADC over an integral number of periods of the modulation function.

The synchronous processing section comprises an analog summing section configured to combine output values of the first discrete time analog signal processing section over an integral number of periods of the modulation function.

The signal processing device further comprises a clock input for accepting a clocking signal according to which the controller operates the first discrete time analog signal processing. In some examples, the signal processing device further comprises an output for providing a signal (e.g., a clock signal or a periodic signal) synchronized with the modulation function.

In another aspect, in general, a non-transitory computer readable medium storing a data structure which is operated upon by a program executable on a computer system, the program operating on the data structure to perform a portion of a process to fabricate an integrated circuit including circuitry described by the data structure, the circuitry described in the data structure including the signal processing device.

Advantages of one or more aspects include synchronization of filtering and modulation functions by virtue of synchronized discrete time analog processing, thereby mitigating effects of phase and/or gain error at the modulation frequency of the modulation function.

The combination of the filtering and modulation functions using discrete time analog processing using charge sharing techniques provides power efficient processing within a single integrated circuit.

Other features and advantages of the invention are apparent from the following description, and from the claims.

DESCRIPTION

Approaches to implementing discrete time, continuous amplitude filters using passive charge sharing techniques are described in prior patent applications: U.S. Pat. Pub. 2012/0306569, titled "Charge Sharing Time Domain Filter," published on Dec. 6, 2012; and U.S. Pat. No. 8,547,272, titled "Charge Sharing Analog Computation Circuitry and Applications," issued on Oct. 1, 2013, which are incorporated herein by reference. Various approaches described below implement modulation and/or demodulation (mixing) functions within the charge sharing circuitry at the input, output, and/or between filter blocks implement using the approaches described in the prior patent applications.

Figure 1:
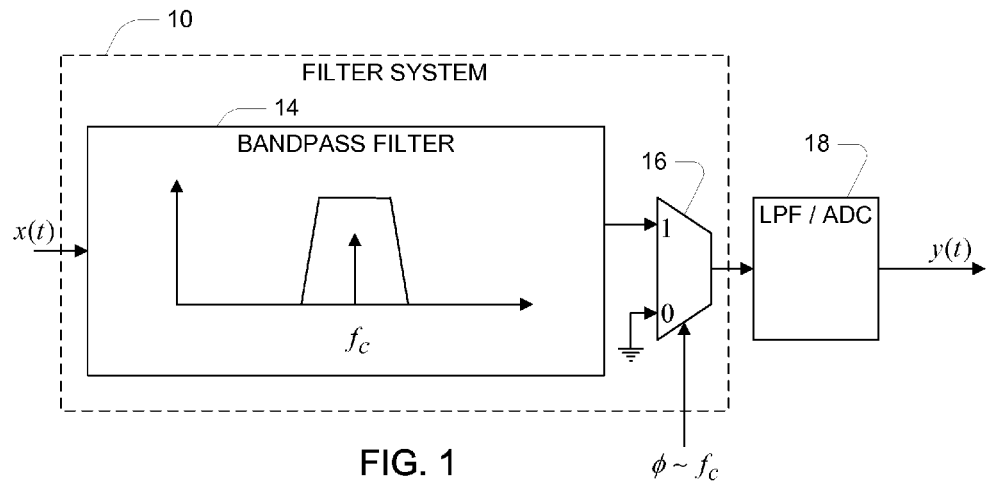
FIG. 1 is a diagram of a filter system implemented using a continuous time analog filter.
Figure 2:
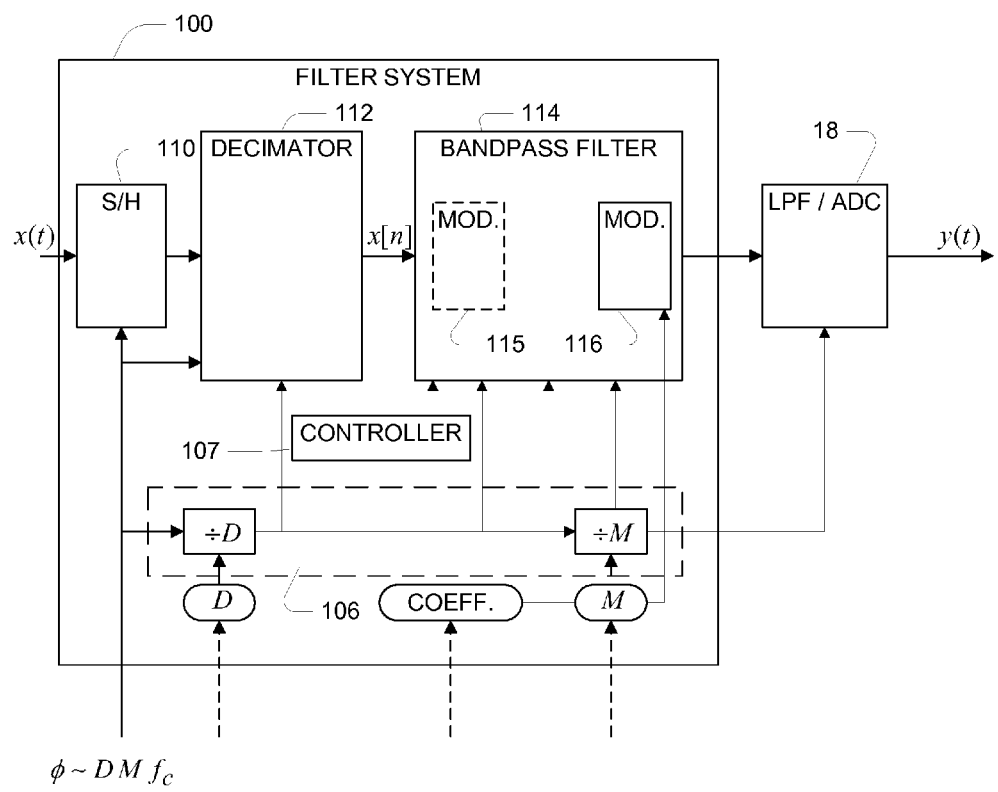
FIG. 2 is a diagram of a filter system implemented using a discrete time analog filter with an integrated modulator.

Referring to FIG. 2, an implementation of a filter system 100 that provides the function implemented by a the filter system 10 represented in FIG. 1 makes use of charge sharing techniques described in the prior patent applications. In general, a controller 107 (e.g., logic circuitry or an instruction based processor) controls operations of switches that couple capacitors in the filter system in clocked phases to implement filtering and other functions by allowing charge to transfer (e.g., by passive charge sharing or redistribution). The configuration of the switches may be set by coefficients that are stored on the system, or provided externally to the system. In operation, the input signal x(t) is passed to a sample-and-hold (S/H) circuit 110, which samples the input signal at a frequency $f_s$, which is a multiple of the center frequency $f_c$ of the desired signal. The factor by which the sampling frequency is greater than the desired center frequency is expressed as a multiple K=DM, for values of D and M discussed below. Not shown is an analog filter (e.g., a first order filter), for example with a corner frequency above $f_c$, providing sufficient attenuation above $f_s/2$ prior to the sample and hold circuit to avoid aliasing. For example, K=128, for example, such that if a $f_c$=10 kHz were desired, the sampling rate would be $f_s$=1.28 MHz. The desired signal is therefore at the discrete time frequency $\omega_c=2\pi/K$.

A decimator 112 decimates the sampled signal by a factor of D, and implements a discrete time lowpass filter with a corner frequency above $\omega_c=2\pi/K$ and attenuating signals above frequency $2\pi/D$, where D is a decimation factor (e.g., D=8). In some examples, the decimator implements a filter with a rolloff of approximately 40 dB per decade. In some examples, D is chosen to be a power of 2, which may simplify certain control circuitry. The output of the lowpass filter is decimated by a factor of D (i.e., every $D^{th}$ sample is retained) to produce the output x[n] of the decimator 112 and that output is passed to a discrete time bandpass filter 114. The sampling rate of the discrete time bandpass filter is therefore (K/D) $f_c$=M $f_c$, in the case of $f_c$=10 kHz, K=128, D=8, and M=16 a sampling rate of 160 kHz. The decimator may be implemented using a finite impulse response or an infinite impulse response filter. In some implementations, a cascade of multiple decimators may be used, for example, decimating by a factor of 16 in two successive stages decimating by factors of 4 each. In general, the decimator is programmable or configurable, for example setting the filter characteristics, decimation factor, cascade structure etc., with the parameters and coefficients for such setting being provided externally to the device and/or being stored in a memory in the device. In some implementations, the bandpass filter 114 may be substituted with another form (i.e., not necessarily bandpass) of filter, which may be programmable based on configuration data (i.e., filter coefficients) that are stored in the system or provided on an input to the system.

The desired signal, originally at frequency $f_c$ (Hertz) is represented in the discrete time signal x[n] provided to the bandpass filter at a discrete time frequency $\omega_d=\omega_c D=2\pi/M$ (radians/second). For example, if K=128 and D=8, then M=16 and the desired signal is at frequency $\omega_d=\pi/8$ (i.e., at the Nyquist sampling rate divided by 8). The output of the bandpass filter (prior to demodulation) is referred to as y[n]. The bandpass filter includes a modulator block 116, which has the effect of multiplying the signal y[n] with a periodic modulating signal m[n] with a period M=K/D samples, in this example a period of 16 samples. The output of the modulator is referred to as z[n]=y[n]×m[n]. In some examples, this periodic signal is equivalent to 8 samples of 1.0 alternating with 8 samples of 0.0. In other examples, the periodic signal has 8 samples of 1.0 alternating with 8 samples of −1.0. In other examples, the output of the modulator is equal to the input for 8 samples, and then $8^{th}$ sample is held for 8 samples. Other periodic functions of the input may be used. The bandpass filter 114 may be implemented as an infinite impulse response or a finite response filter, and may be made up of one or a cascade of multiple stages. As discussed below, in some embodiments, another modulator 115 is present in addition to or instead of the modulator 116, with this modulator being applied before the bandpass filter.

The effective modulating signal m[n] generally has spectral components at frequency $\omega_d=2\pi/M$ as well as at odd harmonics $\omega=k\omega_d$, for k odd, as well as at $\omega=0$ if the periodic signal has a non-zero average value. The bandpass filter provides attenuation at the harmonic frequencies $\omega=2\pi k/(K/D)$ for k=0, 3, 5, . . . , thereby mitigating the impact of noise at those frequencies on the output of the modulator. For example, in the case of K=128 and D=8 (i.e., M=16) the bandpass filter may=provide an rolloff of approximately 40 dB per decade away from the desired frequency.

In some implementations, the bandpass filter 114 is preconfigured to be set (e.g., at power up of the device according to external pin signals) to implement a bandpass filter centered at $\omega_d=7\pi/2, \pi/4, \pi/8, \pi/16, \pi/32, \ldots$ corresponding to selections of M of 4, 8, 16, 32, 64, . . . . Note that values of M≥2 that are not necessary powers of 2 may be used. Furthermore, rational values of M may be used with suitable modulation functions m[n].

The output of the filter system 100 is an analog signal effectively making step changes at the sampling rate $f_cK/D$ of the bandpass filter (e.g., at 160 kHz), which are then processed, for instance as illustrated using an analog lowpass filter and analog to digital converter 18. Of course, other processing of the analog signal could be performed, for example, by analog to digital conversional at the sample rate of the bandpass filter, followed by low pass filtering (e.g., averaging) in a digital processor.

The filter system 100 receives a master clock signal $\phi$ at a frequency D M $f_c$. A clock and control circuit 106 includes a divider of the master clock by a factor D to form a clock at the sampling frequency of the bandpass filter 114, and a clock divider by a factor of M to form a clock at the period of the modulation function m[n]. The divided clocks may be provided from the filter system 100, for example, to synchronize operation of the analog to digital conversion 18 and/or analog or digital averaging of the output of the filter system. In some implementations, the controller 107 controls the operation of clock generation circuitry 106 according to stored or provided parameters. The filter system 100 may have onboard digital storage for the parameters D and M (or functionally equivalent quantities) and/or may have control ports for accepting such parameter values externally. Furthermore, the bandpass filter 114 may have coefficients or other filter configuration data stored on the filter system, for example, for various values of M thereby providing the appropriate filter characteristics as discussed above.

Figure 3:
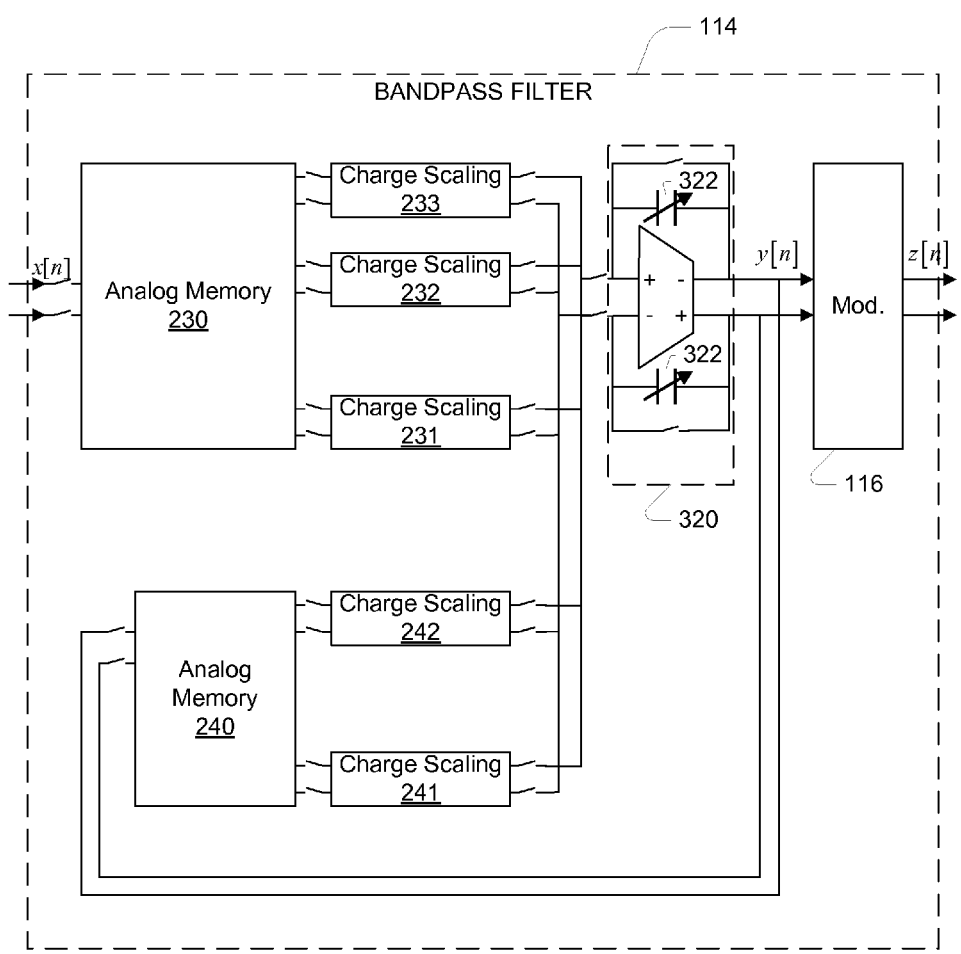
FIG. 3 is a diagram of a bandpass filter section with a modulator.

Referring to FIG. 3, in one implementation, the bandpass filter makes use of an infinite impulse response structure described in detail in U.S. Pat. Pub. 2012/0306569, titled "Charge Sharing Time Domain Filter." Generally, two analog memories 230, 240 store past values of the input samples (x[n]) and the output samples (y[n]), respectively. At each sample time, a controlled amount of charge, which is proportional to the next output value, is transferred from the memories to capacitors 322 of buffer section 320. The output (y[n]) of the buffer section 320 is passed to the modulator 116, and is used to store the output value in the analog memory 240.

More specifically, the bandpass filter section implements a discrete time filter of the form $$h(z) = \frac{b_0 + b_1 z^{-1} + \ldots b_r z^{-r}}{1 + a_0 z^{-1} + \ldots a_{r-1} z^{-(r-1)}}$$

which is illustrated in FIG. 3 for r=2. In this example, the "numerator" analog memory 230 has $r^2$ capacitors, r of which are charged at a time each with a charge proportional to an input sample x[n]. The "denominator" analog memory 240 has $(r-1)^2$ capacitors, r-1 of which are charged at a time each with a charge proportional to an output sample y[n].

For the $n^{th}$ time step, charge scaling circuits 231-233 each transfer charges to a capacitor (or set of capacitors) in the charge scaling circuit such that the transferred charges in the charge scaling circuits are proportional to $b_k x[n-k]$, in this example, for k=0, 1, 2 for scaling circuits 231-233, respectively. Similarly, the charge scaling circuits 241-242 each transfer charge to a capacitor (or set of capacitors) in the charge scaling circuit such that the transferred charges in the charge scaling circuits are proportional to $a_k y[n-k-1]$, in this example, for k=0, 1 for scaling circuits 241-242, respectively.

After the charges are transferred to the charge scaling circuits, their charges are transferred to the capacitors 322 in the buffer 320 such that the total charge is proportional to $$\sum_{k=0}^{2} b_k x[n-k] - \sum_{k=0}^{1} a_k y[n-1-k]$$

Note that in the illustrated embodiment, the signals are represented in differential form, therefore each signal is represented as a pair of signal paths, and storage are generally retained in pairs of capacitors.

Note that in practice, the order of the bandpass filter is greater than or equal to two, r≥2. For example, with r=4 the filter has a 40 dB per decade rolloff.

Furthermore, as described fully in U.S. Pat. Pub. 2012/0306569, the bandpass filter is configurable using digital control signals that control the selection and timing of switches in the filter to achieve desired filter coefficients. In some implementations, the configuration of the bandpass filter is provided to the device through a control port, for example, when the device is initially powered on. In some implementations, the bandpass filter is preconfigured with a particular bandpass filter response. In some implementations implementations, a set of preselected configurations are stored in the device and selected by an externally provided control signal. For example, the preselected configurations may select a center frequency from $\omega_d=\pi/4, \pi/8, \pi/16, \pi/32, \ldots$ and/or a bandwidth $\omega_b$, as defined above.

Figure 4:
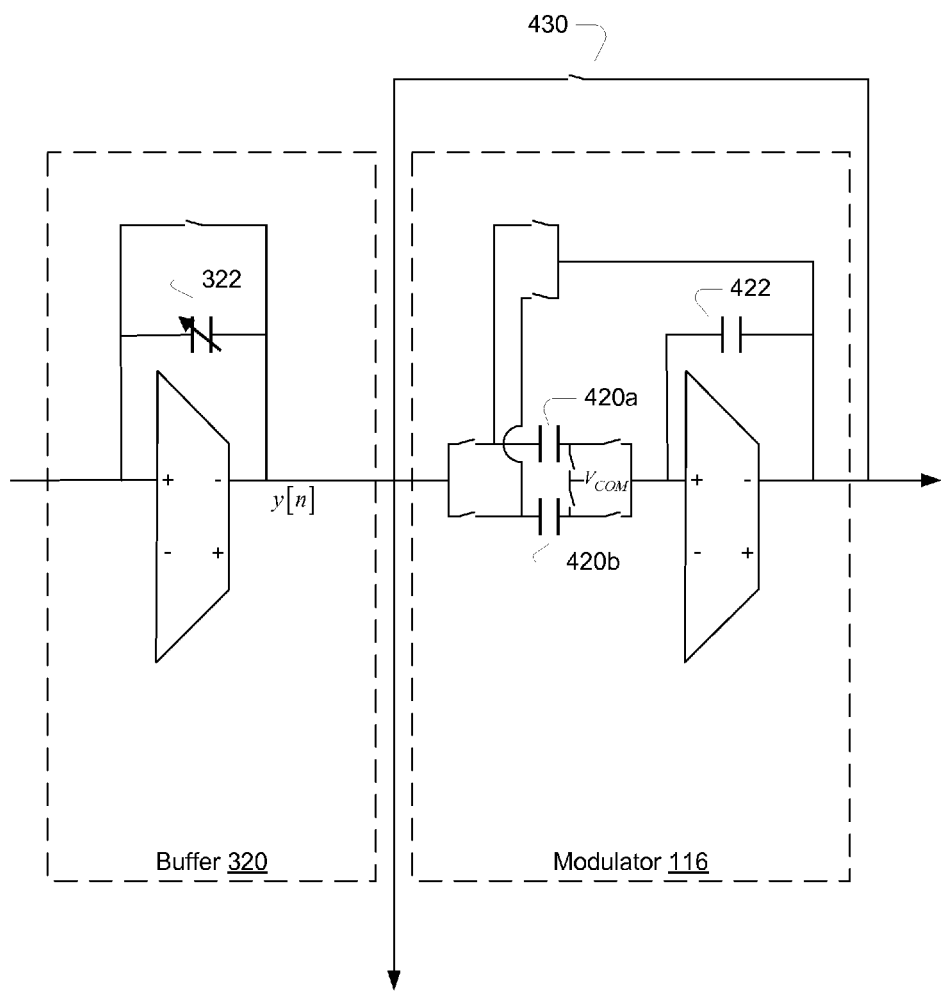
FIG. 4 is a diagram of a buffer and modulator.

Referring to FIG. 4, one implementation of the modulator 116 makes use of capacitors 420*a-b*, which for the samples the m[n]=1.0 sample the output voltage on alternating samples of y[n]. Each capacitor, for example, 420*a* is coupled between y[n] and the common voltage $V_{COM}$ during one sample, and provides is coupled between the input and output of the differential operational amplifier of the modulator during the next cycle. During samples for which m[n]=0.0, the output of the operational amplifier is held at the last value of y[n] for which m[n]=1.0. Note that in FIG. 4, the signal lines of only half of the differential signal path are shown, with the other half having the same topology as that shown. In some implementations the capacitor 422 is relatively small and is provided for stability of the operational amplifier. In other implementations, the capacitor 422 is large enough to provide a first order time domain filtering of the output.

In operation, the modulator can be disabled by continuously using the capacitors 420*a-b* to pass all the sample values. In some implementations, a further bypass pass is switchable to couple the output of the buffer 320 to the output of the part, for example, if buffering and/or modulation of the output is not needed.

Note that alternative configurations of the modulator may be used. For example, a modulator that uses m[n]=±1.0 is can be implemented by introducing switches to reverse the polarity of the charging of capacitors 420*a-b* during the m=−1.0 part of the cycle. Also, in some alternative embodiments, the operational amplifier of the modulator may be omitted, for example, by passing the voltages on capacitors 420*a-b* being coupled to output pins of the device without buffering or amplification. In yet another alternative, the entire modulator is implemented with switches that alternatively couple the output of the device to the output of the buffer 320 or to a zero output, or alternatively couple the output of the device to the output of the buffer or to an inversion of the buffer, As introduced above, in addition to or as an alternative to the modulator 116 another modulator 115 may be added prior to the input of the bandpass filter prior to the "numerator" analog memory 230. At least conceptually, rather than receiving the decimated signal x[n], this signal is multiplied by a periodic signal p[n], for example, having values p[n]=±1.0. One way to implement this multiplication is by controlling the switch timing that couples the input signal x[n] to the memory 230 to alternate the polarity of the charging paths, or to alternate between passing the input signal and providing a zero input to the analog memory 230.

Another way to implement the pre-modulation is through control of the charge scaling circuits 231-233, for example, to switch between introducing a scaling by $+b_k$ and $-b_k$ to cause the modulation by p[n]. Furthermore, the modulation function p[n] does not necessarily have to be a square wave. For example, the scaling circuits can be configured to provide a time varying scaling by $b_k p[n-k]$, for example, to implement a sinusoidal modulation.

Similarly, the output modulation does not necessarily use a square wave. For example, alternative approaches to transferring charge from the buffer 320 to capacitors 420*a-b* can be used to effectively scale the output of the bandpass filter by a different magnitude at different time samples. In a somewhat similar approach, the analog memory 240 may be augmented to provide a further stored value of the output, and a further scaling circuit of the form of scaling circuits 241-242 may be used to implement the modulation of the output by introducing periodically time-varying scaling.

The filter system 100, optionally with an analog-to-digital converter 18, may be integrated into a single package. In some implementations, the output of the analog-to-digital converter 18 is averaged over the period (or multiple periods) of modulation (i.e., over M samples or an integer multiple of M samples) synchronous with the modulation, for example, by summing the digital outputs of the converter in a summer that may also be integrated into the package. The filter system 100 may also implement a lowpass filtering and summing in an analog domain in the package, for example, accumulating charge over M samples or an integer multiple of M samples and providing the summed output from the device.

In some versions, the factors K, M and/or D, are fixed, and the characteristics of the bandpass filter can be fixed. In other versions, at least some configuration of the device is possible, for example, with externally provided signals when the device is powered up, or using non-volatile storage (e.g., ROM) in the device.

In some implementations, a computer accessible storage medium includes a database representative of the system 100. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system 100. The netlist may then be placed and routed to produce a data set describing geometric shapes to be applied to masks. The masks may then be used in various semiconductor fabrication steps to produce a semiconductor circuit or circuits corresponding to the system 100. In other examples, the database may itself be the netlist (with or without the synthesis library) or the data set.

It is to be understood that the foregoing description is intended to illustrate and not to limit the scope of the invention, which is defined by the scope of the appended claims. Other embodiments are within the scope of the following claims.

What is claimed is:

1. A signal processing device comprising:
a first discrete time analog signal processing section comprising an input, an output, a plurality of charge storage elements, and plurality of switch elements coupling the charge storage elements; and
a controller coupled to the first signal processing section configured to couple different subsets of the charge elements of the first signal processing section in successive operating phases to apply a signal processing function to an analog signal presented at the input of the first signal processing section and provide a result of the applying of the signal processing function as an analog signal to the output of first signal processing section;
wherein the signal processing function of the first signal processing section comprises a combination of a filtering function operating at a first sampling rate and one or more modulation functions operating at corresponding modulation rates lower than the first sampling rate.

2. The signal processing device of claim 1 wherein the signal processing function comprises a second modulation function of the one or more modulation functions applied to result of the filtering function.

3. The signal processing device of claim 2 wherein the controller is configured to implement the second modulation function having a modulation period by passing signal values proportional to the result of the filtering function for half the modulation period, and where the output values in the other half of the modulation period are either zero, a constant value determined from the result of the filtering function, or proportional to a negative of the result of the filtering function.

4. The signal processing device of claim 2 wherein the controller is configured to implement the second modulation function to provide output values that are proportional to products of the results of the filtering section and values of a periodic modulation signal.

5. The signal processing device of claim 1 wherein the signal processing function comprises the filtering function applied to a result of a first modulation function of the one or more modulation functions.

6. The signal processing device of claim 2 wherein the controller is configured to implement the first modulation function by storing values in a first set of the charge storage elements of the first discrete time analog signal processing according to the modulation function.

7. The signal processing device of claim 2 wherein the controller is configured to implement the first modulation function by storing values in a first set of the charge storage elements of the first discrete time analog signal processing according to the input to said first section, and to scale said values according to the modulation function in applying the filtering function.

8. The signal processing device of claim 1 wherein the filtering function comprises a linear time invariant (LTI) filtering function.

9. The signal processing device of claim 1 wherein the filtering function comprises a bandpass filtering function.

10. The signal processing device of claim 8 wherein the LTI filtering function comprises an infinite impulse response filtering function.

11. The signal processing device of claim 1 wherein the controller is configured to synchronize discrete time application of the filtering function and the one or more modulating functions.

12. The signal processing device of claim 1 further comprising:
a decimator section, comprising an input and an output coupled to the input of the first discrete time analog signal processing section, wherein the decimator section comprises a plurality of charge storage elements, and plurality of switch elements coupling the charge storage elements, and
wherein the controller is further configurable to couple different subsets of the charge elements in successive operating phases to apply discrete time lowpass filtering function at an input sampling rate to an analog signal presented at the input of the decimator and provide a representation of the analog signal presented at said input at the first sampling rate lower that the input sampling rate.

13. The signal processing device of claim 1 further comprising:
a synchronous processing section coupled to the output of the a first discrete time analog signal processing section;
wherein the controller is configured to synchronize operation of the synchronous processing section and the modulation function of the first signal processing section.

14. The signal processing device of claim 13 wherein the synchronous processing section comprises an analog to digital converter (ADC) converting an analog output from the first discrete time analog signal processing section to digital form.

15. The signal processing device of claim 14 wherein the synchronous processing section comprises a digital summing section configured to sum outputs of the ADC over an integral number of periods of the modulation function.

16. The signal processing device of claim 13 wherein the synchronous processing section comprises an analog summing section configured to combine output values of the first discrete time analog signal processing section over an integral number of periods of the modulation function.

17. The signal processing device of claim 1 further comprising a clock input for accepting a clocking signal according to which the controller operates the first discrete time analog signal processing.

18. The signal processing device of claim 17 further comprising an output synchronized with the modulation function.

19. A non-transitory computer readable medium storing a data structure which is operated upon by a program executable on a computer system, the program operating on the data structure to perform a portion of a process to fabricate an integrated circuit including circuitry described by the data structure, the circuitry described in the data structure including:
a first discrete time analog signal processing section comprising an input, an output, a plurality of charge storage elements, and plurality of switch elements coupling the charge storage elements; and
a controller coupled to the first signal processing section configured to couple different subsets of the charge elements of the first signal processing section in successive operating phases to apply a signal processing function to an analog signal presented at the input of the first signal processing section and provide a result of the applying of the signal processing function as an analog signal to the output of first signal processing section;
wherein the signal processing function of the first signal processing section comprises a combination of a filtering function operating at a first sampling rate and one or more modulation functions operating at corresponding modulation rates lower than the first sampling rate.

\* \* \* \* \*